United States Patent
Lee et al.

(10) Patent No.: US 7,378,353 B2
(45) Date of Patent: May 27, 2008

(54) HIGH SELECTIVITY BPSG TO TEOS ETCHANT

(75) Inventors: Whonchee Lee, Boise, ID (US); Kevin J. Torek, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/321,111

(22) Filed: Dec. 29, 2005

(65) Prior Publication Data

US 2006/0102586 A1    May 18, 2006

Related U.S. Application Data

(60) Continuation of application No. 09/358,940, filed on Jul. 22, 1999, now abandoned, which is a division of application No. 09/056,323, filed on Apr. 7, 1998, now Pat. No. 6,232,232.

(51) Int. Cl.
  *H01I 21/302*    (2006.01)
(52) U.S. Cl. .................. 438/745; 438/750; 438/752; 252/79.1
(58) Field of Classification Search ................ 438/745, 438/750, 752; 252/79.1
  See application file for complete search history.

(56) References Cited

U.S. PATENT DOCUMENTS

| | | | |
|---|---|---|---|
| 4,069,074 A * | 1/1978 | Yanushonis et al. | 438/545 |
| 4,230,522 A * | 10/1980 | Martin et al. | 438/669 |
| 4,372,803 A | 2/1983 | Gigante | |
| 4,395,304 A | 7/1983 | Kern et al. | |
| 4,443,933 A | 4/1984 | de Brebisson | |
| 4,721,548 A | 1/1988 | Morimoto | |
| 4,938,850 A | 7/1990 | Rothschild et al. | |
| 5,039,612 A | 8/1991 | Stacher | |
| RE33,800 E | 1/1992 | Fornwalt et al. | |
| 5,094,900 A | 3/1992 | Langley | |
| 5,296,400 A | 3/1994 | Park et al. | |
| 5,300,463 A * | 4/1994 | Cathey et al. | 438/703 |
| 5,340,765 A | 8/1994 | Dennison et al. | |
| 5,364,813 A | 11/1994 | Koh | |
| 5,386,429 A * | 1/1995 | Naito et al. | 372/46.01 |
| 5,395,482 A | 3/1995 | Onda et al. | |
| 5,405,802 A | 4/1995 | Yamagata et al. | |
| 5,413,678 A | 5/1995 | Hossain | |

(Continued)

FOREIGN PATENT DOCUMENTS

JP    56029332    3/1981

(Continued)

*Primary Examiner*—Lan Vinh
(74) *Attorney, Agent, or Firm*—TraskBritt

(57) ABSTRACT

An organic acid/fluoride-containing solution etchant having high selectivity for BPSG to TEOS. In an exemplary situation, a TEOS layer may be used to prevent contamination of other components in a semiconductor device by the boron and phosphorous in a layer of BPSG deposited over the TEOS layer. The etchant of the present invention may be used to etch desired areas in the BPSG layer, wherein the high selectivity for BPSG to TEOS of etchant would result in the TEOS layer acting as an etch stop. A second etch with a known etchant may be utilized to etch the TEOS layer. The known etchant for the second etch can be less aggressive and, thus, not damage the components underlying the TEOS layer.

13 Claims, 3 Drawing Sheets

U.S. PATENT DOCUMENTS

| | | |
|---|---|---|
| 5,436,188 A | 7/1995 | Chen |
| 5,439,553 A | 8/1995 | Grant et al. |
| 5,497,016 A | 3/1996 | Koh |
| 5,510,645 A | 4/1996 | Fitch et al. |
| 5,543,346 A | 8/1996 | Keum et al. |
| 5,597,756 A | 1/1997 | Fazan et al. |
| 5,643,819 A | 7/1997 | Tseng |
| 5,654,244 A | 8/1997 | Sakai et al. |
| 5,679,475 A | 10/1997 | Yamagata et al. |
| 5,780,338 A | 7/1998 | Jeng et al. |
| 5,824,601 A | 10/1998 | Dao et al. |
| 5,843,322 A | 12/1998 | Chandler, Jr. |
| 5,843,821 A | 12/1998 | Tseng |
| 5,857,885 A | 1/1999 | Laou et al. |
| 5,869,403 A | 2/1999 | Becker et al. |
| 5,883,002 A | 3/1999 | Shih et al. |
| 6,077,742 A | 6/2000 | Chen et al. |
| 6,132,232 A * | 10/2000 | Okada ........................ 439/357 |
| 6,232,232 B1 * | 5/2001 | Lee et al. ................... 438/694 |
| 6,251,742 B1 | 6/2001 | Lin |
| 6,271,117 B1 * | 8/2001 | Cherng ....................... 438/624 |
| 6,335,279 B2 | 1/2002 | Jung et al. |

FOREIGN PATENT DOCUMENTS

| | | |
|---|---|---|
| JP | 60-147164 | 3/1985 |

* cited by examiner

HIGH SELECTIVITY BPSG TO TEOS ETCHANT

CROSS-REFERENCE TO RELATED APPLICATIONS

This application is a continuation of application Ser. No. 09/358,940, filed Jul. 22, 1999, now abandoned, which is a divisional of application Ser. No. 09/056,323, filed Apr. 7, 1998, now U.S. Pat. No. 6,232,232, issued May 15, 2001.

BACKGROUND OF THE INVENTION

1. Field of the Invention

The present invention relates to etchant formulations for semiconductor device production. More particularly, the present invention relates to an etchant formulation with high selectivity between BPSG and TEOS and methods for use of the formulation.

2. State of the Art

Etching is a process for removing material in a specific area through a wet (liquid) or dry (gaseous/vapor) chemical reaction, or by physical removal (such as by sputter etch, in which the specific area is bombarded with radio frequency-excited ions to knock atoms from the specific area). Etching is used in a variety of applications in the fabrication of semiconductor devices. For illustration purposes, vapor etching of bit line openings for a DRAM (Dynamic Random Access Memory) will be discussed.

A widely-utilized DRAM manufacturing process utilizes CMOS (Complementary Metal Oxide Semiconductor) technology to produce DRAM circuits which circuits, comprise an array of unit memory cells, each typically including one capacitor and one transistor, such as a field effect transistor ("FET"). In the most common circuit designs, one side of the transistor is connected to one side of the capacitor, the other side of the transistor and the transistor gate are connected to external circuit lines called the bit line and the word line, and the other side of the capacitor is connected to a reference voltage that is typically one-half the internal circuit voltage. In such memory cells, an electrical signal charge is stored in a storage node of the capacitor connected to the transistor which charges and discharges the circuit lines of the capacitor.

It is known that hydrofluoric acid can be used as an etchant and is selective for BPSG to TEOS. In fact, the selectivity for BPSG to TEOS with hydrofluoric acid alone can be as high as 1000:1 in vapor etch and as low as less than 10:1 for dilute hydrofluoric acid solutions. However, there are some disadvantages associated with vapor etch such as high particle counts and low productivity. Consequently, a wet etchant which could perform the role of high selective vapor would be advantageous.

Therefore, it would be desirable to develop an etchant and a method of use which would eliminate the risk of damaging the surface of the semiconductor substrate without having to use an etch stop layer.

BRIEF SUMMARY OF THE INVENTION

The present invention relates to an organic acid/fluoride-containing solution etchant formulation having high selectivity for BPSG to TEOS and methods for its use in the production of semiconductor devices.

It has been found that the addition of an organic acid (such as acetic acid, formic acid, and oxalic acid) to a fluoride-containing solution (such as hydrofluoric acid and ammonium fluoride) dramatically increases selectivity of BPSG to TEOS without the above-mentioned disadvantages. As mentioned above, most applications with both BPSG and TEOS layers involve using the TEOS layer to prevent contamination of other components in a semiconductor device by the boron and phosphorous in the BPSG. Thus, a typical application consists of a layer of TEOS deposited over the semiconductor device components which require protection and a layer of BPSG applied over the TEOS layer. The etchant of the present invention may be used to etch desired areas in the BPSG layer. The high selectivity for BPSG to TEOS of etchant of the present invention would result in the TEOS layer acting as an etch stop. A second etch may be utilized to etch the TEOS layer. The etchant for the second etch can be less aggressive and, thus, not damage the components underlying the TEOS layer.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

As previously discussed, hydrofluoric acid is a known etchant for etching BPSG and TEOS. However, it has been found that the addition of an organic acid (such as acetic acid, formic acid, and oxalic acid) to a fluoride-containing solution (such as hydrofluoric acid and ammonium fluoride (preferably 40% $NH_4F$ in water)) dramatically increases selectivity of BPSG to TEOS. Most preferably, the etchant comprises an acetic acid/hydrofluoric acid mixture.

Etchants were formulated from glacial acetic acid (99.7% by weight in water) and hydrofluoric acid (49% by weight in water). The results (etch rate, selectivity and uniformity) of various etchant formulations are presented in Table 1, as follows:

TABLE 1

| Etchant (vol. ratio glacial acetic acid to 49% HF) | Etching rate through TEOS (Å/min) | Etching rate through BPSG (Å/min) | BPSG Standard Deviation (%) | Selective ratio (BPSG/TEOS) |
|---|---|---|---|---|
| 200:1 | 2.2 | 59 | 0 | 27 |
| 100:1 | 4.6 | 193 | 2.4 | 42 |
| 50:1 | 11.6 | 638 | 13.7 | 55 |

As it can be seen from Table 1, the selectivity and uniformity increased with increasing hydrofluoric acid concentration. The preferred etchant to obtain high selectivity and good uniformity is 100:1 volume ratio of 99.7% glacial acetic acid to 49% hydrofluoric acid. However, it is believed that etchant ratios ranging from 1:1 to 500:1 will achieve adequate selectivity.

Figure 1:
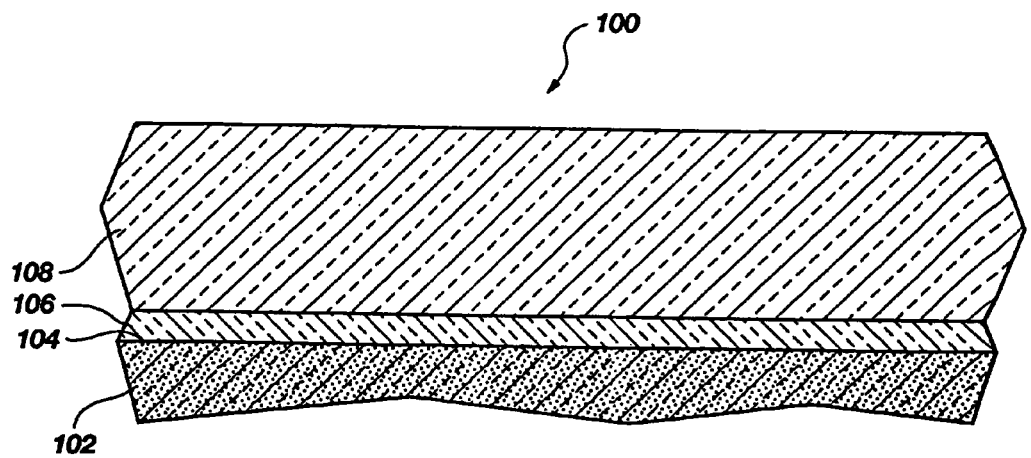
FIGS. 1-5 are side cross-sectional views of a method of forming an opening using an etchant according to the present invention.

FIGS. 1-5 illustrate a technique for utilizing an etchant of the present invention in the formation of an opening in a BPSG layer. FIG. 1 illustrates an intermediate structure 100 comprising a substrate 102 having a first side 104 with a first barrier layer 106 of TEOS applied thereover. A second barrier layer 108 of BPSG is deposited over the first TEOS barrier layer 106.

Figure 2:
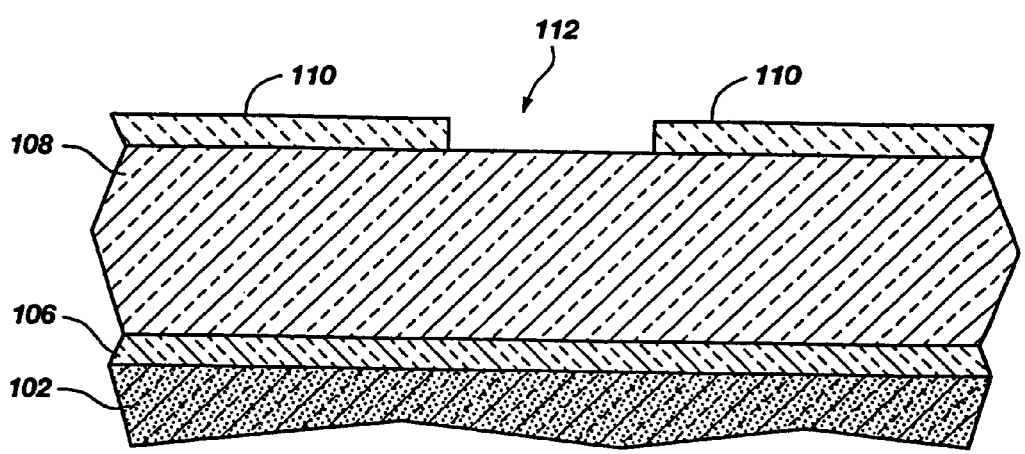
Figure 3:
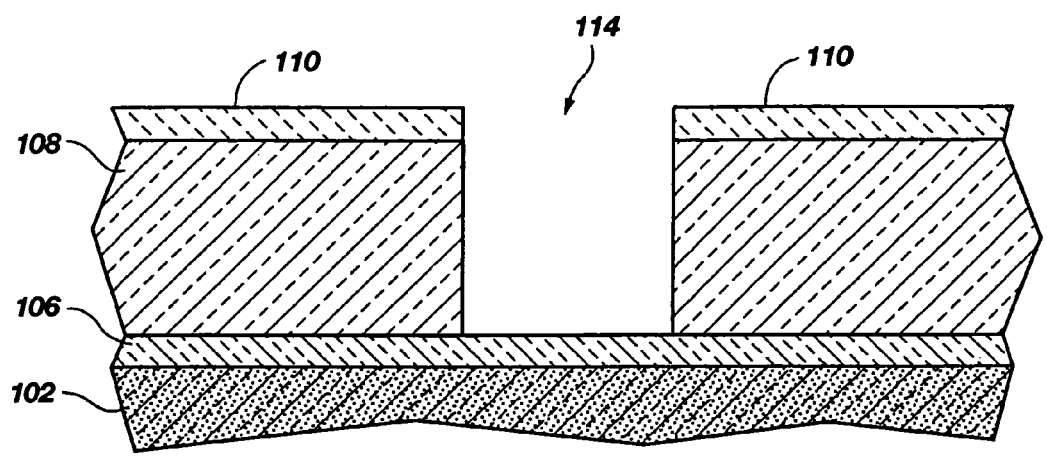
Figure 4:
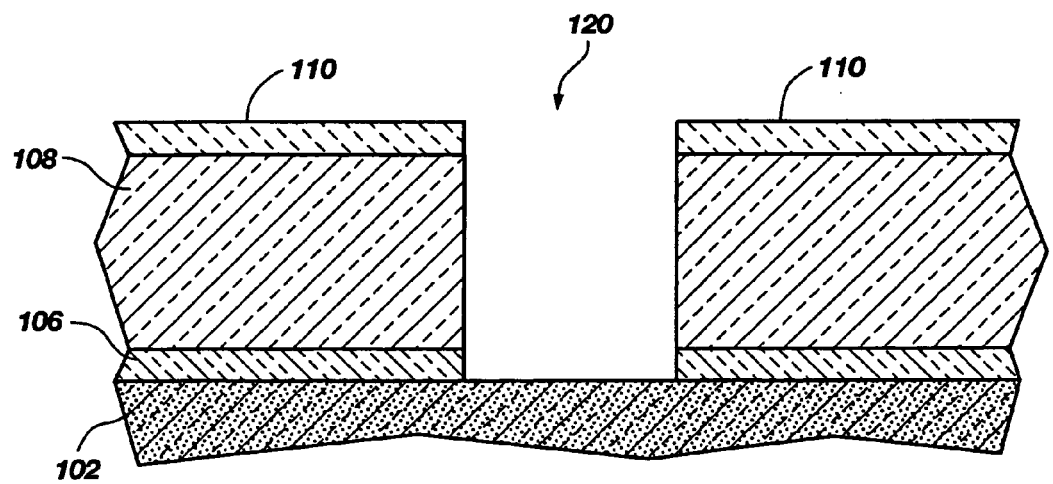
Figure 5:
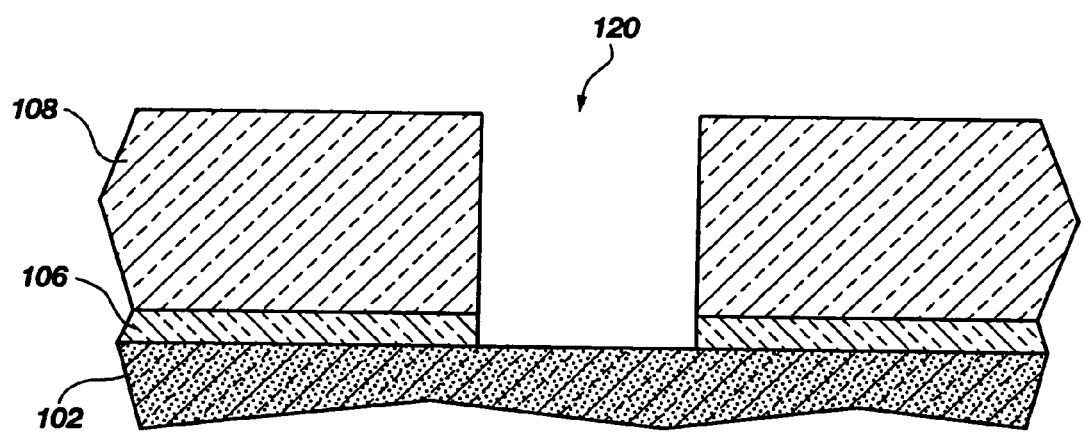

A nitride layer 110 is patterned over the second barrier layer 108 of BPSG and has at least one opening 112, as shown in FIG. 2. The second barrier layer 108 of BPSG is etched with an etchant of the present invention to form a partial opening 114. Since the etchant of the present invention is selective to BPSG, the etch effectively ceases at the first barrier layer 106 of TEOS, as shown in FIG. 3. The first barrier layer 106 of TEOS is then etched with a less aggressive etchant, such as a TMAH/hydrofluoric acid mixture or a 35-40% by weight ammonium fluoride/4-6% by weight phosphoric acid solution in water, which is less damaging to the substrate 102, to form a full opening 120, as shown in FIG. 4. The nitride layer 110 is stripped, as shown in FIG. 5.

It is, of course, understood that the etchant of the present invention can be utilized in any etching situation where selectivity of BPSG to TEOS barrier layers is desired, such as contact openings, container etching, and the like. Furthermore, the etchant of the present invention can be utilized in processes, such as a double side container process, wherein no masking step is required.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of forming an opening in a borophosphosilicate glass layer on a semiconductor device, the method comprising:
   providing a layer of borophosphosilicate glass over a layer of tetraethyl orthosilicate;
   masking a pattern on the borophosphosilicare glass layer; and
   etching the borophosphosilicate glass layer through an opening in the pattern with an etchant comprising a fluoride-containing solution and an organic acid selected from the group consisting of oxalic acid and formic acid to form a via including substantially vertical sidewalls from a lowermost portion of the via to an upper most portion of the via in the borophospliosilicate glass layer and to expose the underlying tetraethyl orthosilicate.

2. The method of claim 1, wherein the fluoride-containing solution is selected from the group consisting of hydrofluoric acid and ammonium fluoride.

3. The method of claim 1, wherein the organic acid comprises formic acid and the fluoride-containing solution comprises 49% hydrofluoric acid by weight in water.

4. The method of claim 1, wherein the formic acid is in a volumetric ratio with the hydrofluoric acid from between about 1:1 to 500:1.

5. The method of claim 2, wherein the formic acid is in a volumetric ratio with the hydrofluoric acid at about 10:1 to about 100:1.

6. The method of claim 1, wherein the organic acid comprises formic acid and the fluoride-containing solution comprises 40% ammonium fluoride acid by weight in water.

7. The method of claim 1, wherein the etchant includes a selectivity ratio of borophosphosilicate glass to tetraethyl orthosilicate between about 27:1 and 55:1.

8. A method of selectively etching a borophosphosilicate glass layer on a semiconductor device, the method comprising:
   providing a semiconductor substrate having a layer of tetraethyl orthosilicate and an overlying layer of borophosphosilicate glass; and
   contacting the borophosphosilicate glass layer with a solution comprising a fluoride-containing solution and an organic acid selected from the group consisting of oxalic acid and formic acid to form a via including substantially vertical sidewalls from a lowermost portion of the via to an upper most portion of the via in the borophosphosilicate glass layer and to expose the underlying tetraethyl orthosilicare.

9. The method of claim 8, wherein the organic acid comprises oxalic acid and the fluoride-containing solution comprises 40% ammonium fluoride acid by weight in water.

10. The method of claim 8, wherein the solution includes a selectivity ratio of borophosphosilicate glass to tetraethyl orthosilicate between about 27:1 and 55:1.

11. The method of claim 8, wherein the organic acid comprises oxalic acid and the fluoride-containing solution comprises 49% hydrofluoric acid by weight in water.

12. The method of claim 11, wherein the oxalic acid is in a volumetric ratio with the hydrofluoric acid from between about 1:1 to 500:1.

13. The method of claim 12, wherein the oxalic acid is in a volumetric ratio with the hydrofluoric acid at about 10:1 to about 100:1.

* * * * *

UNITED STATES PATENT AND TRADEMARK OFFICE
CERTIFICATE OF CORRECTION

PATENT NO. : 7,378,353 B2 Page 1 of 1
APPLICATION NO. : 11/321111
DATED : May 27, 2008
INVENTOR(S) : Lee et al.

It is certified that error appears in the above-identified patent and that said Letters Patent is hereby corrected as shown below:

In column 3, line 38, in Claim 1, delete "borophosphosilicare" and insert -- borophosphosilicate --, therefor.

In column 3, lines 46-47, in Claim 1, delete "borophospliosilicate" and insert -- borophosphosilicate --, therefor.

In column 4, line 32, in Claim 8, delete "orthosilicare." and insert -- orthosilicate. --, therefor.

Signed and Sealed this

Twenty-sixth Day of August, 2008

JON W. DUDAS
*Director of the United States Patent and Trademark Office*